US008817544B2

(12) United States Patent
Sato

(10) Patent No.: US 8,817,544 B2
(45) Date of Patent: Aug. 26, 2014

(54) READOUT CIRCUIT FOR NON-VOLATILE MEMORY DEVICE

(71) Applicant: Seiko Instruments Inc., Chiba (JP)

(72) Inventor: Yutaka Sato, Chiba (JP)

(73) Assignee: Seiko Instruments Inc., Chiba (JP)

( * ) Notice: Subject to any disclaimer, the term of this patent is extended or adjusted under 35 U.S.C. 154(b) by 95 days.

(21) Appl. No.: 13/746,859

(22) Filed: Jan. 22, 2013

(65) Prior Publication Data

US 2013/0188425 A1 Jul. 25, 2013

(30) Foreign Application Priority Data

Jan. 24, 2012 (JP) ................................. 2012-012318

(51) Int. Cl.
*G11C 16/28* (2006.01)
*G11C 16/26* (2006.01)

(52) U.S. Cl.
CPC ............... *G11C 16/26* (2013.01); *G11C 16/28* (2013.01)
USPC .................................................. 365/185.21

(58) Field of Classification Search
CPC ................................ G11C 16/26; G11C 16/28
USPC ........................................................ 365/185.21
See application file for complete search history.

(56) References Cited

U.S. PATENT DOCUMENTS

| | | | |
|---|---|---|---|
| 6,400,607 B1 * | 6/2002 | Pasotti et al. | 365/185.21 |
| 6,515,907 B2 | 2/2003 | Miyagi | |
| 7,167,394 B2 * | 1/2007 | La Placa et al. | 365/185.2 |
| 7,369,450 B2 * | 5/2008 | Choy | 365/205 |
| 7,522,463 B2 * | 4/2009 | Pelli et al. | 365/205 |

* cited by examiner

*Primary Examiner* — Harry W Byrne
*Assistant Examiner* — Lance Reidlinger
(74) *Attorney, Agent, or Firm* — Brinks Gilson & Lione

(57) ABSTRACT

Provided is a readout circuit for a non-volatile memory device, which has a large readout margin for distinguishing between 0 and 1 of data and has a small circuit area. A voltage output from a single bias circuit is applied to a gate of a memory element and a gate of an NMOS transistor serving as a reference current source to be compared with a current flowing through the memory element. Thus, the gates are controlled by the same voltage, and hence characteristics fluctuations in the operating temperature range and the operating power supply voltage range are reduced. Therefore, a large readout margin for distinguishing 0 and 1 of data can be obtained, resulting in a simplified circuit configuration.

8 Claims, 5 Drawing Sheets

VOLTAGE COMPARATOR CIRCUIT

READOUT CIRCUIT FOR NON-VOLATILE MEMORY DEVICE

RELATED APPLICATIONS

This application claims priority under 35 U.S.C. §119 to Japanese Patent Application No. 2012-012318 filed on Jan. 24, 2012, the entire content of which is hereby incorporated by reference.

BACKGROUND OF THE INVENTION

1. Field of the Invention

The present invention relates to a readout circuit for an electrically rewritable non-volatile memory device.

2. Description of the Related Art

FIG. 5 illustrates a conventional floating gate tunnel oxide (FLOTOX) non-volatile memory device. The conventional FLOTOX non-volatile memory device includes a single memory element 51 connected to a current load circuit formed of NMOS transistors 54 and 55 and a single dummy memory element 61 connected to a current load circuit formed of NMOS transistors 64 and 65, and converts a current generated by the memory element 51 and a current generated by the dummy memory element 61 into voltages. The converted voltages are compared with each other in a voltage comparator circuit formed of NMOS transistors 56, 66, and 70 and PMOS transistors 57 and 67, to thereby distinguish between 0 and 1 of data.

The memory element 51 has a binary value in the depletion state and the enhancement state. The voltage at an input node of the voltage comparator circuit on the memory element side changes depending on the difference in the state. Therefore, this voltage is compared with a reference voltage at an input node of the voltage comparator circuit on the dummy memory element 61 side, to thereby distinguish between 0 and 1 of data.

In general, in the FLOTOX non-volatile memory device, repeated rewriting of data leads to deterioration in film quality of a tunnel oxide film, resulting in a small threshold difference between the depletion state and the enhancement state. In a readout circuit required to read out data over the entire operating temperature range and the entire operating power supply voltage range, if the threshold difference becomes smaller as described above, it becomes difficult to distinguish between 0 and 1 of data, and it becomes impossible to distinguish between 0 and 1 of data in the operating temperature range and the operating power supply voltage range. In other words, a readout margin for distinguishing between 0 and 1 of data is reduced.

SUMMARY OF THE INVENTION

In order to solve the above-mentioned problem, a readout circuit for a non-volatile memory device according to the present invention has the following configuration.

A readout circuit for a non-volatile memory device includes: a memory element including a source connected to a ground voltage and a gate connected to one end of a first memory element selection switch; a select gate transistor including a source connected to a drain of the memory element and a gate controlled by a select gate selection control signal; a second memory element selection switch connected between the select gate transistor and an output terminal of the readout circuit; a first NMOS transistor serving as a reference current source to be compared with a current flowing through the memory element; a first PMOS transistor serving as a current mirror source and including a drain connected to a drain of the first NMOS transistor; a second PMOS transistor serving as a current mirror destination of the first PMOS transistor and including a drain connected to the output terminal of the readout circuit; and a first bias circuit for supplying a bias voltage to a gate of the first NMOS transistor and the gate of the memory element.

According to the readout circuit for a non-volatile memory device of the present invention, the gate of the memory element and the gate of the NMOS transistor serving as the reference current source to be compared with the current flowing through the memory element are controlled by the same voltage, and a dummy transistor and a dummy switch are added. Thus, the characteristics fluctuations in the operating temperature range and the operating power supply voltage range are reduced. In other words, there is an effect that a large readout margin for distinguishing 0 and 1 of data can be obtained.

Further, the number of circuit elements can be reduced to realize a smaller circuit area as compared with the conventional circuit configuration, resulting in cost reduction effect.

DETAILED DESCRIPTION OF THE PREFERRED EMBODIMENTS

First Embodiment

Figure 1:
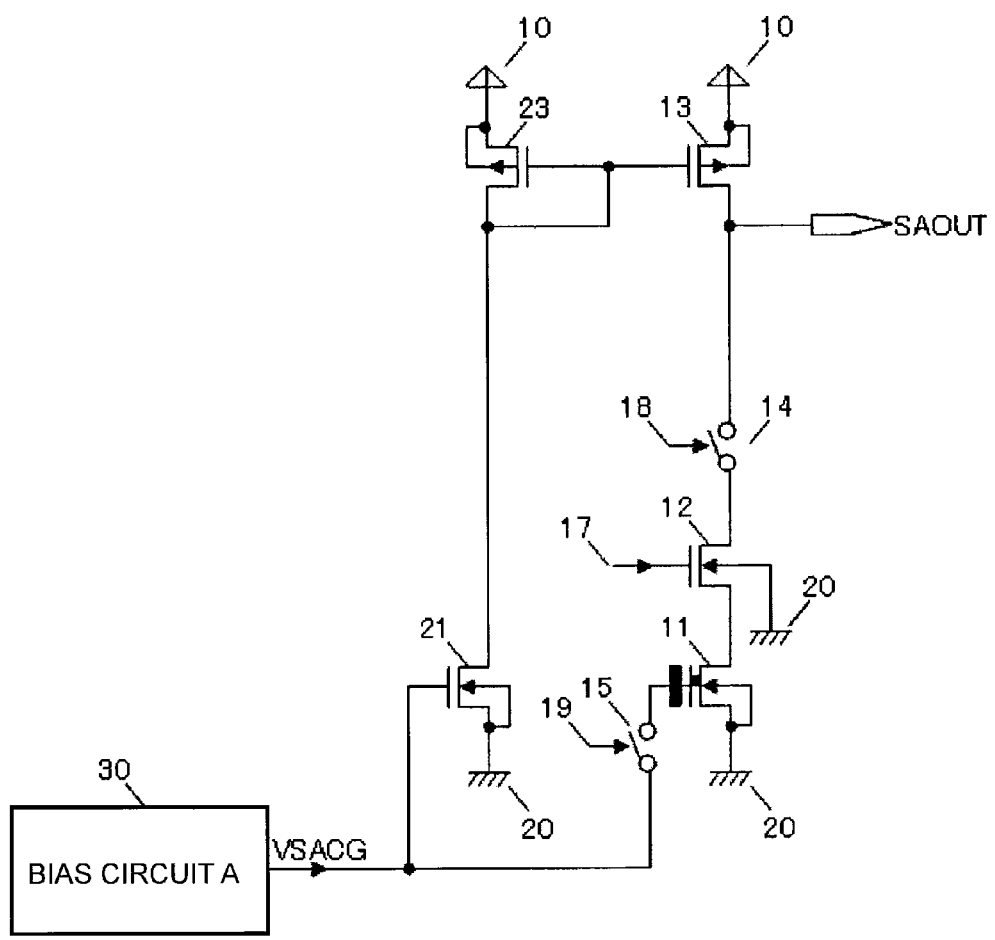
FIG. 1 is a circuit diagram illustrating a readout circuit for a non-volatile memory device according to a first embodiment of the present invention.

FIG. 1 is a circuit diagram illustrating a readout circuit for a non-volatile memory device according to a first embodiment of the present invention.

The readout circuit for a non-volatile memory device in the first embodiment includes a memory element 11, a select gate transistor 12, memory element selection switches 14 and 15, an NMOS transistor 21, PMOS transistors 13 and 23, and a bias circuit 30.

The memory element 11 has a source connected to a ground voltage 20, and a gate connected to the memory element selection switch 15. The select gate transistor 12 has a source connected to a drain of the memory element 11, and a gate for inputting a select gate selection control signal 17. The memory element selection switch 14 has one end connected to a drain of the select gate transistor 12 and the other end connected to an output terminal SAOUT of the readout circuit. The NMOS transistor 21 has a source connected to the ground voltage 20, and a drain connected to a drain of the PMOS transistor 23. The PMOS transistor 13 and the PMOS transistor 23, which are current-mirror connected, have an input connected to the drain of the NMOS transistor 21 and an output connected to the output terminal SAOUT. The bias circuit 30 has an output terminal connected to a gate of the NMOS transistor 21 and to the gate of the memory element 11 via the memory element selection switch 15.

The select gate transistor 12 is controlled to be turned ON/OFF by the select gate selection control signal 17. The memory element selection switch 14 is controlled to be turned ON/OFF by a memory element selection control signal 18. The memory element selection switch 15 is controlled to be turned ON/OFF by a memory element selection control signal 19. The NMOS transistor 21 is a reference current source for distinguishing data of the memory element 11. The bias circuit 30 supplies a bias voltage VSACG to the gate of the NMOS transistor 21 and to the gate of the memory element 11 via the memory element selection switch 15. The current-mirror connected PMOS transistor 13 and PMOS transistor 23 supply a current equal to a reference current generated by the NMOS transistor 21 to the output terminal SAOUT.

Next, the operation of the readout circuit in the first embodiment is described.

The select gate transistor 12 is controlled to be turned ON by the select gate selection control signal 17. The memory element selection switch 14 is controlled to be turned ON by the memory element selection control signal 18. The memory element selection switch 15 is controlled to be turned ON by the memory element selection control signal 19. In this case, when the bias voltage VSACG is applied to the gate of the memory element 11, the memory element 11 supplies a current I1 between the source and the drain thereof. The memory element 11 has a binary value in the depletion state and the enhancement state. The current I1 is large in the depletion state, and the current I1 is small in the enhancement state. A reference current I2 generated by the NMOS transistor 21, on the other hand, flows to the memory element 11 via the current-mirror connected PMOS transistor 23 and PMOS transistor 13.

Then, the output terminal SAOUT outputs a predetermined voltage depending on the magnitude relation between the current I1 and the current I2. For example, when the memory element 11 is in the depletion state, the currents satisfy the relation of I1>I2. Accordingly, the output terminal SAOUT outputs a voltage close to the ground voltage 20, and hence data of the memory element 11 is determined to be 0. When the memory element 11 is in the enhancement state, on the other hand, the currents satisfy the relation of I1<I2. Accordingly, the output terminal SAOUT outputs a voltage close to a power supply voltage 10, and hence data of the memory element 11 is determined to be 1. In this manner, the data of the memory element 11 can distinguish between 0 and 1.

The following two settings only need to be considered in determining a setting value related to the important characteristics of readout enable/disable.

(1) Optimum setting of the voltage VSACG as a bias voltage having an intermediate value between the threshold value in the depletion state and the threshold value in the enhancement state (2) Optimum setting of the size of the NMOS transistor 21 so as to have a current difference large enough for comparison between 0 and 1 of data The conventional readout circuit controls the gates by different bias voltages CGBIAS and FGBIAS. In this embodiment, however, the gates are controlled by the same voltage, and hence the characteristics fluctuations in the operating temperature range and the operating power supply voltage range are reduced. In other words, a large readout margin for distinguishing between 0 and 1 of data can be obtained.

The current value I1 of the memory element 11 is compared with the current value I2 of the PMOS transistor 13 forming the current mirror circuit for mirroring the current from the NMOS transistor 21 serving as the reference current source. Thus, no voltage comparator circuit is used, and hence the number of circuit elements is reduced. Further, a single bias circuit is used, and hence the number of circuit elements is reduced. In this manner, the circuit area can be reduced to cut the cost.

In addition, the determination of the setting value related to the important characteristics of readout enable/disable only needs to consider the above-mentioned two settings, and hence the time spent for circuit design can be shortened as well.

Second Embodiment

Figure 2:
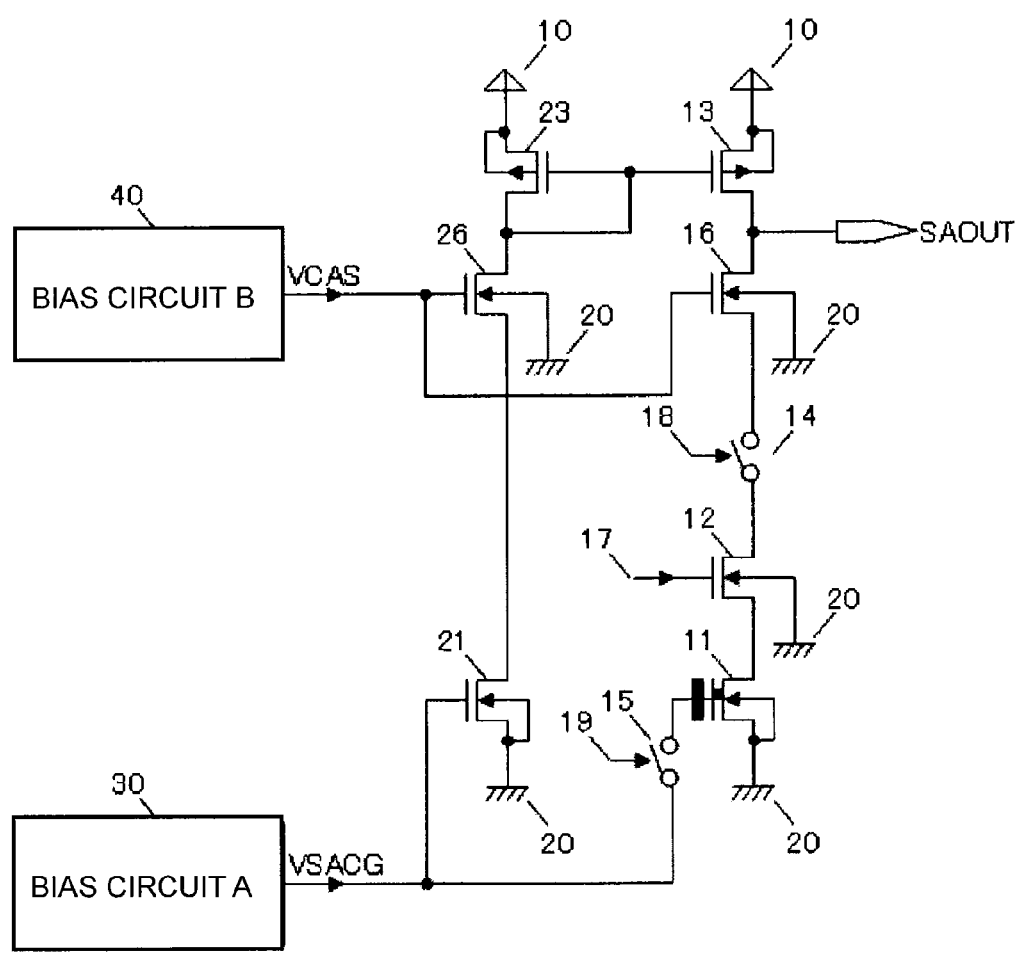
FIG. 2 is a circuit diagram illustrating a readout circuit for a non-volatile memory device according to a second embodiment of the present invention.

FIG. 2 is a circuit diagram illustrating a readout circuit for a non-volatile memory device according to a second embodiment of the present invention.

In addition to the readout circuit for a non-volatile memory device in the first embodiment, the readout circuit for a non-volatile memory device in the second embodiment includes an NMOS transistor 16, an NMOS transistor 26, and a bias circuit 40.

The NMOS transistor 16 has a source connected to one end of the memory element selection switch 14, and a drain connected to the output terminal SAOUT of the readout circuit. The NMOS transistor 26 has a source connected to the drain of the NMOS transistor 21, and a drain connected to the drain of the PMOS transistor 23. The bias circuit 40 has an output terminal connected to gates of the NMOS transistors 16 and 26.

The NMOS transistor 16 clamps the voltage so that electric charges stored in the memory element 11 may not be discharged by application of a high voltage more than necessary to a bit line as a node of the drain of the select gate transistor 12 in reading. The NMOS transistor 16 also suppresses an increase in drain voltage of the memory element 11 due to an increase in power supply voltage, to thereby suppress fluctuations in current change amount caused by the power supply voltage. Similarly to the NMOS transistor 16, the NMOS transistor 26 suppresses an increase in drain voltage of the NMOS transistor 21 due to an increase in power supply voltage, to thereby suppress fluctuations in current change amount caused by the power supply voltage. The bias circuit 40 outputs a bias voltage VCAS for determining a clamp voltage. When the NMOS transistors 16 and 26 each have a threshold voltage VTN, the respective source voltages are clamped to a voltage of VCAS-VTN, and do not increase to be more than the voltage of VCAS-VTN. It is preferred that the NMOS transistors 16 and 26 have the same characteristics and the same transistor size.

The operation of the readout circuit for a non-volatile memory device in the second embodiment is similar to that of the readout circuit for a non-volatile memory device in the first embodiment. The current I1 generated by the memory element 11 is compared with the reference current I2 generated by the NMOS transistor 21, to thereby distinguish between 0 and 1 of data of the memory element 11.

Unlike the readout circuit for a non-volatile memory device in the first embodiment, the readout circuit for a non-volatile memory device in the second embodiment clamps the voltage by the NMOS transistors 16 and 26, and hence the fluctuations in current change amount caused by the power supply voltage can be suppressed.

A setting value related to the important characteristics of readout enable/disable can be easily set merely by, in addition to the setting method described in the readout circuit for a non-volatile memory device in the first embodiment, setting the voltage of VCAS-VTN as a voltage for preventing the electric charges stored in the memory element 11 from being discharged.

As described above, the readout circuit for a non-volatile memory device in the second embodiment provides the effects of preventing the discharge of electric charges stored in the memory element 11, preventing the increase in drain voltage of the memory element 11 and the NMOS transistor 21 due to the increase in power supply voltage, and suppressing the fluctuations in current change amount caused by the power supply voltage. In other words, a larger readout margin for distinguishing between 0 and 1 of data of the memory element 11 can be obtained.

Third Embodiment

Figure 3:
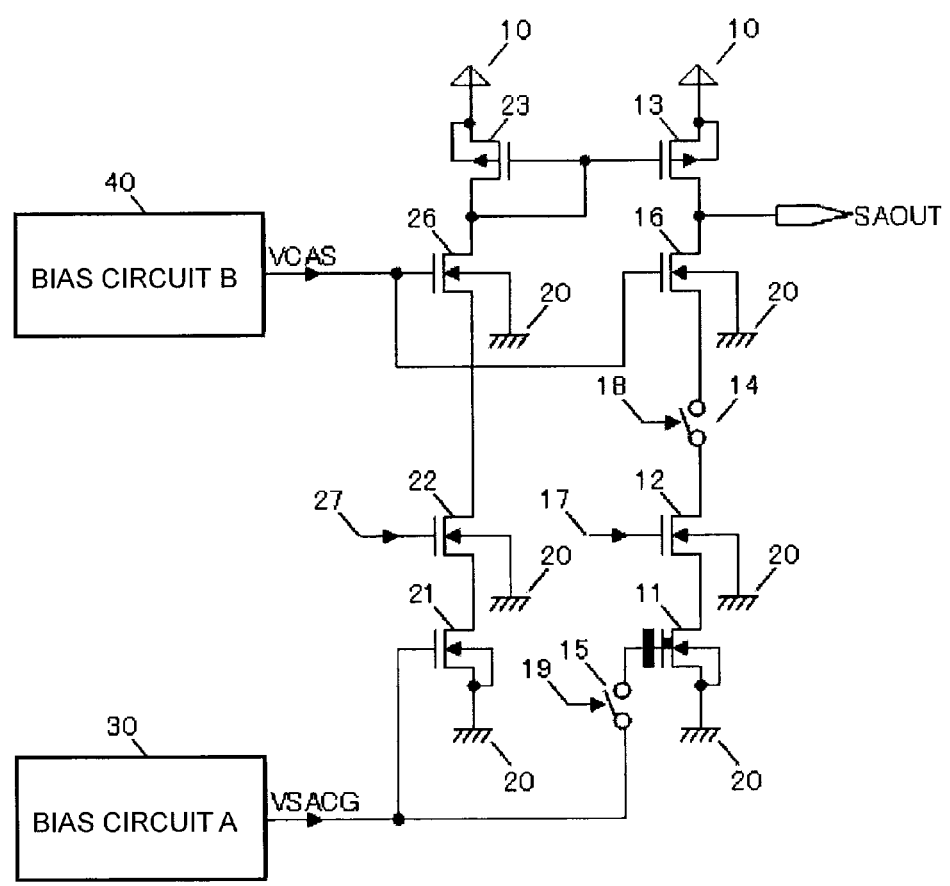
FIG. 3 is a circuit diagram illustrating a readout circuit for a non-volatile memory device according to a third embodiment of the present invention.

FIG. 3 is a circuit diagram illustrating a readout circuit for a non-volatile memory device according to a third embodiment of the present invention.

In addition to the readout circuit for a non-volatile memory device in the second embodiment, the readout circuit for a non-volatile memory device in the third embodiment includes an NMOS transistor 22.

The NMOS transistor 22 has a source connected to the drain of the NMOS transistor 21, and a drain connected to the source of the NMOS transistor 26. A dummy gate control signal 27 is input to a gate of the NMOS transistor 22.

The NMOS transistor 22 is controlled to be turned ON/OFF by the dummy gate control signal 27.

The NMOS transistor 22 is a transistor whose transistor size and element structure are set to be virtually adjusted to the characteristics of the select gate transistor 12.

The circuit operation is similar to that of the readout circuit for a non-volatile memory device in the second embodiment, and the current I1 generated by the memory element 11 is compared with the reference current I2 generated by the NMOS transistor 21, to thereby distinguish between 0 and 1 of data of the memory element 11. When the power supply voltage decreases, the select gate transistor 12 becomes difficult to be turned ON, and the drain voltage of the memory element 11 decreases to reduce the current value of the memory element 11. However, the dummy select gate transistor 22 is added as a virtual select gate transistor, and hence the current value of the NMOS transistor 21 is also reduced by the reduced current value of the memory element 11. Therefore, the direction of the inequality sign of the comparison currents can be maintained.

A setting value related to the important characteristics of readout enable/disable can be easily set merely by, in addition to the setting method described in the readout circuit for a non-volatile memory device in the second embodiment, setting the transistor size and the element structure so as to be virtually adjusted to the characteristics of the select gate transistor 12.

As described above, in the readout circuit for a non-volatile memory device in the third embodiment, a larger readout margin for distinguishing 0 and 1 of data at a low power supply voltage can be obtained because of the above-mentioned reason.

Fourth Embodiment

Figure 4:
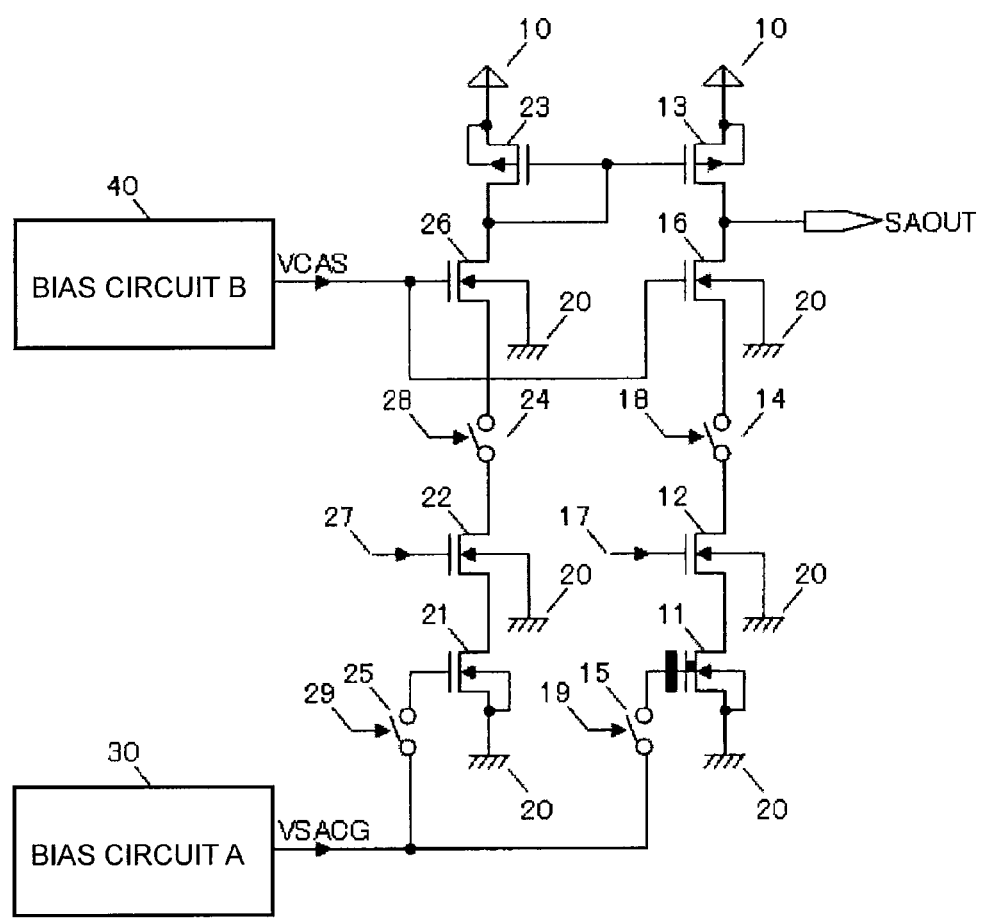
FIG. 4 is a circuit diagram illustrating a readout circuit for a non-volatile memory device according to a fourth embodiment of the present invention.
Figure 5:
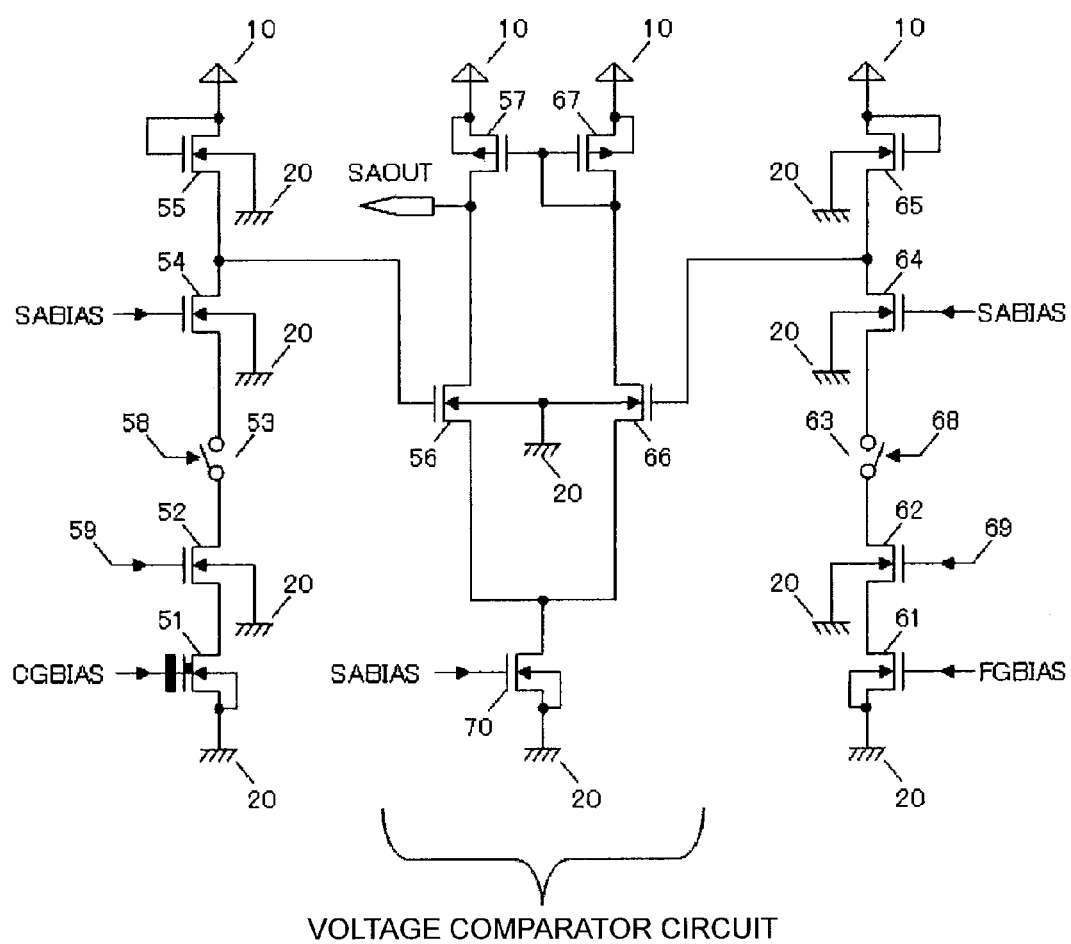
FIG. 5 is a circuit diagram illustrating a conventional readout circuit for a non-volatile memory device.

FIG. 4 is a circuit diagram illustrating a readout circuit for a non-volatile memory device according to a fourth embodiment of the present invention.

In addition to the readout circuit for a non-volatile memory device in the third embodiment, the readout circuit for a non-volatile memory device in the fourth embodiment includes dummy switches 24 and 25.

The dummy switch 24 has one end connected to the source of the NMOS transistor 26 and the other end connected to the drain of the NMOS transistor 22. The dummy switch 25 has one end connected to the output VSACG of the bias circuit 30 and the other end connected to the gate of the NMOS transistor 21.

The dummy switch 24 is controlled to be turned ON/OFF by a dummy switch control signal 28. The dummy switch 25 is controlled to be turned ON/OFF by a dummy switch control signal 29.

The memory element selection switch 14 and the dummy switch 24 have the same characteristics. The memory element selection switch 15 and the dummy switch 25 also have the same characteristics.

Next, the operation of the readout circuit for a non-volatile memory device in the fourth embodiment is described.

The dummy switch 24 is controlled to be turned ON by the dummy switch control signal 28. The dummy switch 25 is controlled to be turned ON by the dummy switch control signal 29. The following operation is similar to that of the readout circuit for a non-volatile memory device in the third embodiment, and distinguishes between 0 and 1 of data by comparing the current I1 generated by the memory element 11 with the reference current I2 generated by the NMOS transistor 21.

The added dummy switches 24 and 25 can cancel the characteristics deviation between the currents I1 and I2, which occurs due to a minute ON-state resistance generated when the memory element selection switches 14 and 15 for selecting the memory element are turned ON.

A setting value related to the important characteristics of readout enable/disable can be easily set merely by, in addition to the setting method described in the third embodiment, setting the memory element selection switch 14 and the dummy switch 24 as the same switches and the memory element selection switch 15 and the dummy switch 25 as the same switches.

As described above, in the readout circuit for a non-volatile memory device in the fourth embodiment, because of the above-mentioned reason, the characteristics fluctuations are further mitigated, and a larger readout margin for distinguishing between 0 and 1 of data can be obtained.

The NMOS transistor 22 and the dummy switches 24 and 25 are normally in the ON state in reading, and hence the dummy gate control signal 27 and the dummy switch control signals 28 and 29 may control the gates to be in the normally ON state. For example, the gate of the NMOS transistor 22 may be connected directly to the power supply voltage 10.

The bias circuit 30 and the bias circuit 40 may be shared so as to supply voltages having the same characteristics to the respective gates of the memory element 11, the NMOS transistor 21, the NMOS transistor 16, and the NMOS transistor 26. In this case, the readout circuit includes a single bias circuit, and hence the circuit area and cost can be reduced.

What is claimed is:

1. A readout circuit for an electrically rewritable non-volatile memory device, comprising:
   a memory element including a source connected to a ground voltage, and a gate connected to one end of a first memory element selection switch controlled by a first memory element selection control signal;
   a select gate transistor including a source connected to a drain of the memory element, and a gate controlled by a select gate selection control signal;
   a second memory element selection switch including one end connected to a drain of the select gate transistor, and another end connected to an output of the readout circuit, the second memory element selection switch being controlled by a second memory element selection control signal;

a first NMOS transistor serving as a reference current source to be compared with a current flowing through the memory element;

a current mirror circuit comprising a first PMOS transistor and a second PMOS transistor, the first PMOS transistor including a gate and a drain which are connected to a drain of the first NMOS transistor, the second PMOS transistor including a gate connected to the gate of the first PMOS transistor and a drain connected to the output of the readout circuit; and a first bias circuit including an output terminal connected to a gate of the first NMOS transistor and to another end of the first memory element selection switch.

2. A readout circuit for a non-volatile memory device according to claim 1, further comprising:

a second NMOS transistor provided between the first NMOS transistor and the first PMOS transistor;

a third NMOS transistor provided between the second memory element selection switch and the output of the readout circuit; and a second bias circuit for supplying a bias voltage to a gate of the second NMOS transistor and a gate of the third NMOS transistor.

3. A readout circuit for a non-volatile memory device according to claim 2, further comprising a fourth NMOS transistor provided between the first NMOS transistor and the second NMOS transistor, the fourth NMOS transistor including a gate controlled by a dummy gate control signal.

4. A readout circuit for a non-volatile memory device according to claim 3, wherein the fourth NMOS transistor comprises a transistor having the same characteristics as the select gate transistor.

5. A readout circuit for a non-volatile memory device according to claim 3, further comprising:

a first dummy switch including one end connected to an output of the first bias circuit and another end connected to the gate of the first NMOS transistor, the first dummy switch being controlled by a first dummy switch control signal; and a second dummy switch including one end connected to a source of the second NMOS transistor and another end connected to a drain of the fourth NMOS transistor, the second dummy switch being controlled by a second dummy switch control signal.

6. A readout circuit for a non-volatile memory device according to claim 5, wherein:

the first memory element selection switch and the first dummy switch have the same characteristics; and the second memory element selection switch and the second dummy switch have the same characteristics.

7. A readout circuit for a non-volatile memory device according to claim 4, further comprising:

a first dummy switch including one end connected to an output of the first bias circuit and another end connected to the gate of the first NMOS transistor, the first dummy switch being controlled by a first dummy switch control signal; and a second dummy switch including one end connected to a source of the second NMOS transistor and another end connected to a drain of the fourth NMOS transistor, the second dummy switch being controlled by a second dummy switch control signal.

8. A readout circuit for a non-volatile memory device according to claim 7, wherein:

the first memory element selection switch and the first dummy switch have the same characteristics; and the second memory element selection switch and the second dummy switch have the same characteristics.

* * * * *